United States Patent [19]

Leclerc

[11] 3,775,646

[45] Nov. 27, 1973

[54] MOSAIC OF M.O.S. TYPE SEMICONDUCTOR ELEMENTS

[75] Inventor: Pierre Leclerc, Paris 16eme, France

[73] Assignee: Thomson-CSF, Paris, France

[22] Filed: Mar. 5, 1973

[21] Appl. No.: 338,263

Related U.S. Application Data

[63] Continuation of Ser. No. 164,273, July 20, 1971, abandoned.

[30] Foreign Application Priority Data

Aug. 7, 1970 France ............................ 70029261

[52] U.S. Cl. ..... 317/235 R, 317/235 N, 317/235 B, 317/235 G

[51] Int. Cl. ........................ H01l 15/00, H01l 11/14

[58] Field of Search .................... 317/235 N, 235 B, 317/235 G, 235 R

[56] References Cited

UNITED STATES PATENTS

| | | | |
|---|---|---|---|
| 3,623,026 | 11/1971 | Engeler | 340/173 LS |
| 3,593,067 | 7/1971 | Flynn | 317/234 R |
| 3,465,293 | 9/1969 | Weckler | 340/166 |
| 3,631,312 | 12/1971 | Moyle | 317/234 |
| 3,339,128 | 8/1967 | Olmstead | 317/235 |
| 3,601,668 | 8/1971 | Slaten | 317/234 R |

*Primary Examiner*—Martin H. Edlow
*Attorney*—G. Lloyd Knight

[57] ABSTRACT

A metal matrix of photo-M.O.S. devices, transparent to radiation is provided. A gate is associated with each of the collectors of the matrix. Said gate overlaps partly onto the associated collector. The other part of the collector is covered by a layer of insulating material and a thick layer, connected to the gate of the neighbouring element of the same line in a plane located between the two collectors. The collectors of one and the same column are electrically connected. The gates of one and the same line are electrically connected.

6 Claims, 7 Drawing Figures

MOSAIC OF M.O.S. TYPE SEMICONDUCTOR ELEMENTS

This is a continuation, of application Ser. No. 164,273 filed July 20, 1971, now abandoned.

The present invention relates to a structure made up of M.O.S. (metal oxide semiconductor) semiconductor elements, which is used more especially for read-out applications in optical memories.

It is known in the art to provide an M.O.S. element which comprises a substrate of a first conductivity type, for example N type. Locally diffused into this substrate is a collector of opposite conductivity type and a dielectric layer is deposited upon the assembly thus formed. A metal gate, which is transparent vis-a-vis the kind of radiation being used, is deposited upon the dielectric layer. The substrate is earthed. The PN junction is reverse-biassed by a negative potential applied to the collector. The gate is also negatively biassed.

It is possible to directly produce matrices made up of elements of this kind. However, these are open to certain drawbacks.

In particular, the input resistance at the junction is high.

The object of the present invention is a photo-M.O.S. element structure, which is not open to these drawbacks.

According to the invention a metal insulator semiconductor structures comprises in combination :

a substrate having a first of conductivity and one face, and on said face, at least one collector having a second type of conductivity opposite to said first type and, associated with said collector:an insulating layer covering partially said face, and laying bare a part of said collector, at least one metal gate deposited on said insulating layer, and connection means for reverse biasing the junction between said substrate and said collector, and, covering partially said bare part of said collector a thick insulating layer, and on said thick layer, a thick layer of metal.

The invention will be better understood from a consideration of the ensuing descriptin and by reference to the attached drawings in which.

Figure 1:
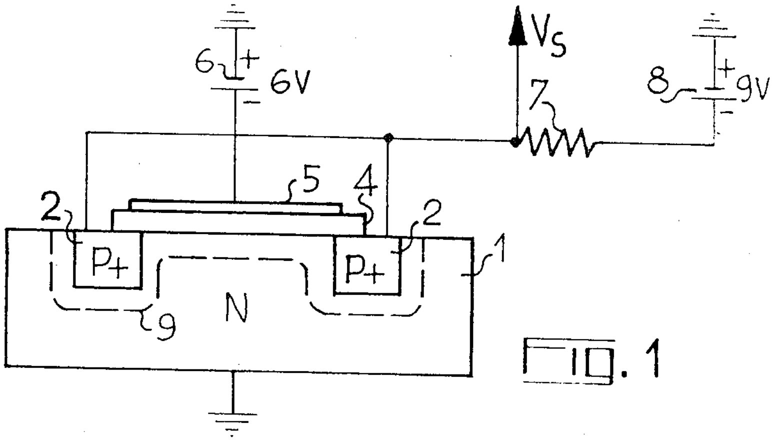
FIG. 1 illustrates a section and FIG. 2 a plan view of a known type of photo-M.O.S. structure.
Figure 2:
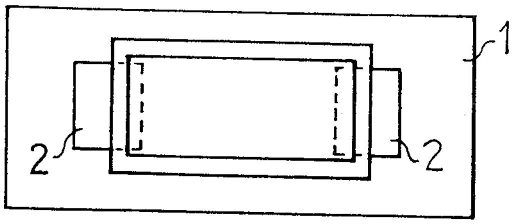

FIGS. 1 and 2 illustrate an embodiment of a known type of photo-M.O.S. device. It comprises a semiconductor substrate 1 of N-type conductivity. Two diffused zones of P+ type have been produced in the substrate. These two diffused zones 2 are the two collectors of the photo-M.O.S. device. Between the two collectors and overlapping each of them, there is deposited an oxide layer 4. Deposited upon the oxide layer 4, in turn, is a metal gate 5, which is transparent vis-a-vis light falling within a certain frequency band. The structure is reverse-biassed in the following manner :

The substrate 1 is earthed, the gate is connected to the negative pole of a direct voltage source 6, the positive pole of this latter being earthed.

The d.c. voltage supplied by this source is for example in the order of −6V.

The collectors 2 are connected through the same resistor 7 to the negative pole of the voltage source 8 whose positive pole is earthed. This source produces a lower negative voltage than the source 6, for example −9V, the output signal being picked up from the common terminal of the collectors and the resistor 7.

The gate 5 is exposed to light radiation, the frequency of which falls within the band for which the gate 5 is transparent. The operation of the system is as follows :

The voltages applied to the collectors and the gate result in the operation within the substrate, of a P-type space charge 9 which develops in the manner indicated by the dotted lines. This space charge forms a potential barrier. When a photon hits the substrate, through the gate 5, it produces an electron-hole pair.

The negative charges or electrons, thanks to the potential barrier created by the space charge, go across the junction P-N thus created, to the ground. Holes or positive charges are collected by the collector which is at a negative potential with respect to the gate. A current is developed in the resistor 7. This current gives rise to an output voltage $V_s$.

The photo-M.O.S. device illustrates affords certain drawbacks ; in particular, the space charge surrounds two collectors. If a matrix is built using M.O.S. devices of this kind, none of these devices will be independent of the others. In other words, if a gate is illuminated, the signal produced will be picked up by several collectors simultaneously.

Figure 3:
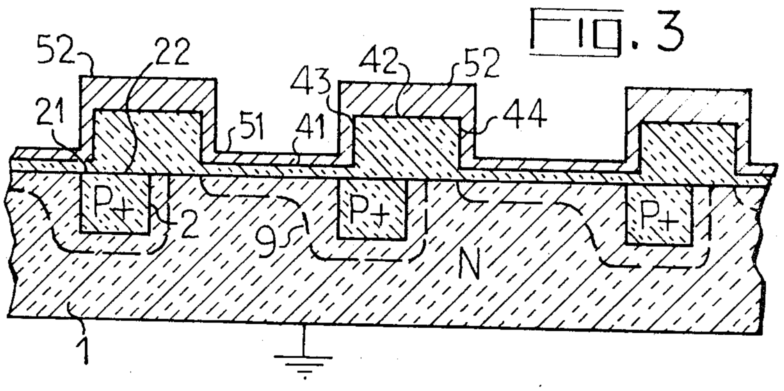
FIG. 3 illustrates a section through the elements of a photo-M.O.S. matrix in accordance with the invention.

The mosaic of photo-M.O.S. devices according to the invention, shown in section in FIG. 3, enables this drawback to be overcome. In this figure, as in the ensuing ones, similar references designate similar elements to those so designated in earlier figures.

The bias connections have not been illustrated but are the same as in FIG. 2.

The substrate 1 and the collectors 2 are identical to those of FIGS. 1 and 2.

In accordance with the invention, the oxide layer 4 comprises thin zones 41 (thickness in the order of 0.1 $\mu$), and thick zones 42 (thickness in the order of 1 to 2 $\mu$).

Each collector corresponds with a zone 42. The connections 43 and 44 between a thin zone 41 and a neighbouring thick zone 42 have substantially flat walls, perpendicular to the substrate.

The connections 43 are slightly staggered in relation to the collectors so that part 21 of them is covered by a thin layer and part 22 by a thick layer.

On the oxide layer 4 there is deposited a metal layer 5 comprising thick portions 52 which are opaque to the radiation and which precisely cover the zones 42, and thin portions 51, which are the gates of the photo-M.O.S. devices and are transparent to the radiation, covering the zones 41, this being due to their different thicknesses.

Figure 4:
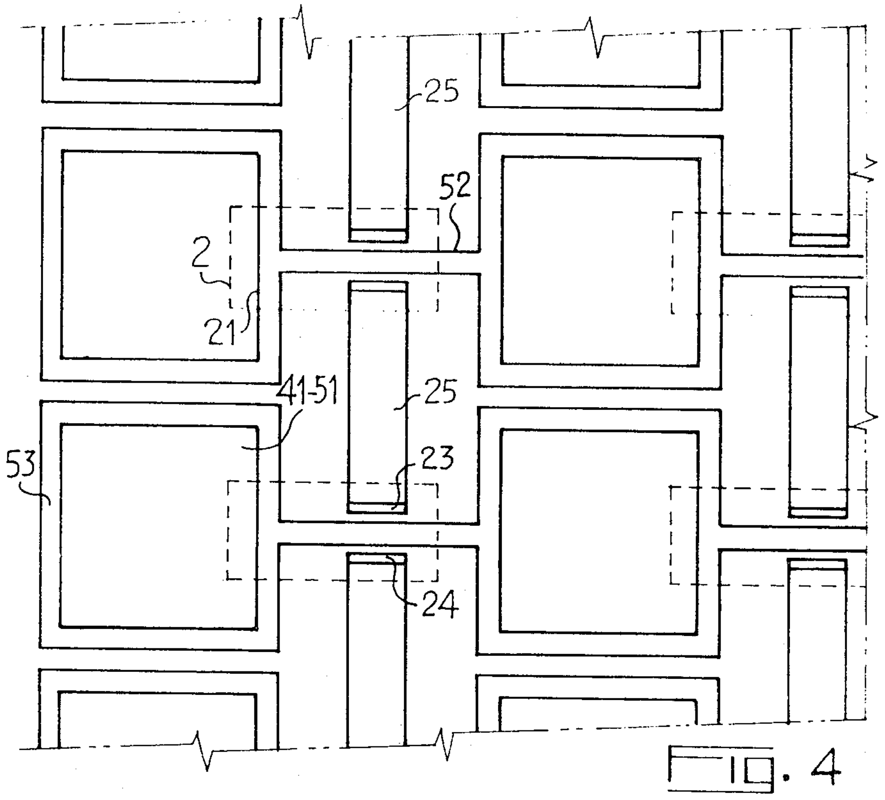
FIG. 4 illustrates a plan view of the same elements.

FIG. 4 illustrates a plan view of the assembly. The oxide layers located beneath the metal are not visible. Each gate takes the form of a rectangle made for example of a very thin nickel layer. All the gates 41 are surrounded by contours 53 made of a thick metal layer. The contours 53 corresponding to elements of one and the same line, are interconnected by thick metal bars 52 which are the zones 52 shown in section in FIG. 3.

The collectors have a portion 21 situated beneath the gates 41. Another portion 22 extends partly beneath the bar 52. Since the latter is thicker than the collector, this latter comprises two zones not covered by the metal. In each of these zones, there are produced, symmetrically in relation to the bar 52, two windows 23 and 24 through which the P+ diffused area layed bare on the substrate. The window 23 is connected by a metal line 25 to the window 24 of the neighbouring collector of the same column.

Figure 5:
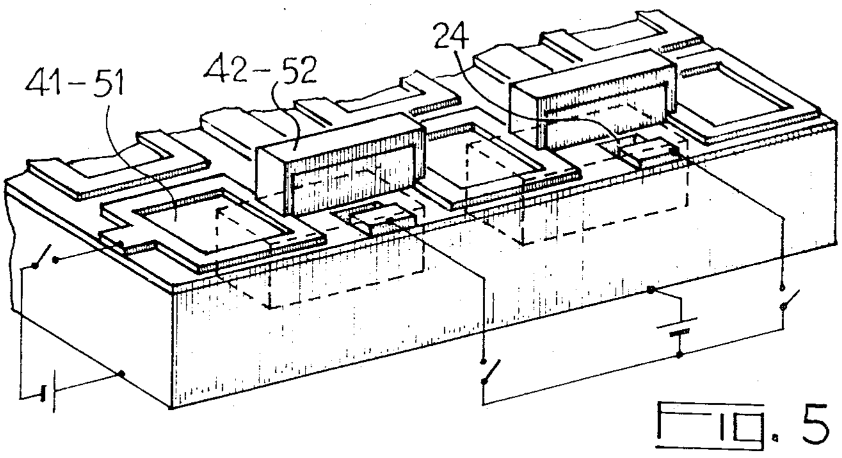
FIG. 5 illustrates the same elements in perspective.

The assembly is shown in perspective in FIG. 5.

Figure 6:
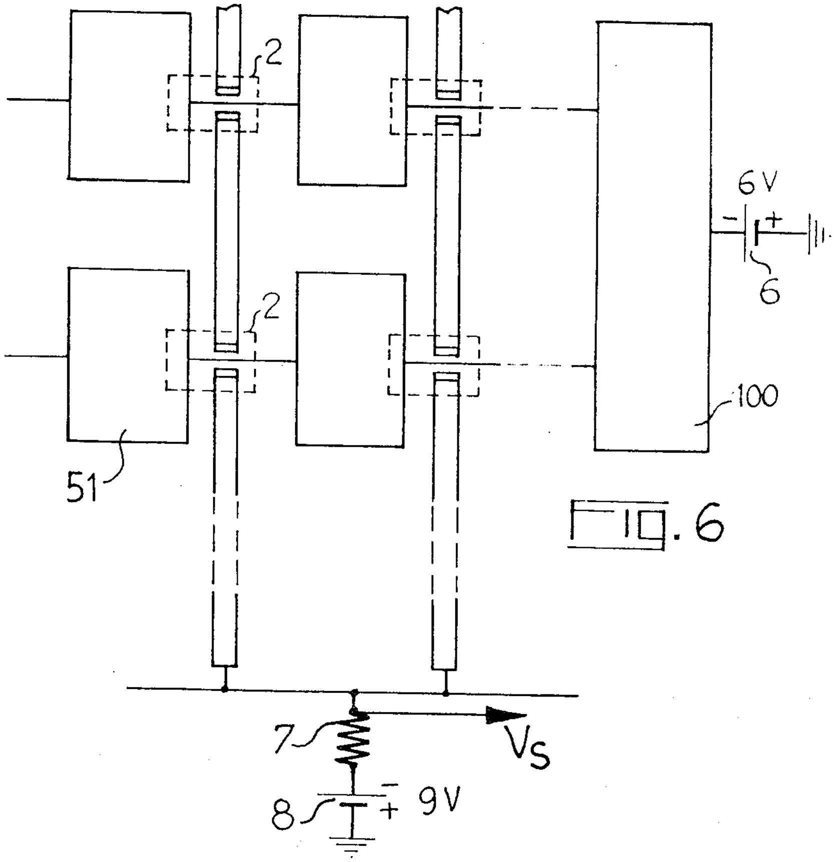
FIG. 6 illustrates the electrical connecting circuits.

The complete matrix is shown in FIG. 6 is a simplified form, as also is the associated electrical circuit.

All the collectors of one and the same column which are connected in series by virtue of the construction, are connected to a voltage source 8 through the medium of a load resistor 7. The voltage source applies a potential of − 9V to them in relation to the substrate.

The gates of one and the same line are connected to an output of a switch 100, for example an electronic switch.

The single input of this switch is connected to the negative pole of a direct voltage source 6 producing a voltage of 6V. The gate lines are thus selectively raised to a potential of − 6V. The operation of the system is as follows : By means of the switch 100, a line of gates is placed at − 6V. All the elements in this line have their P±N junctions reverse-biassed. About each collector there develops a space charge 9 illustrated in dotted fashion in FIG. 3. The electric field is weak beneath the oxide layers and the thick metal layers whereas beneath the gates 41 and the thin oxide layers the electric field is much stronger. The result is that the space charge 9 surrounds the collector 2 and is flush with the substrate of the surface and perpendicular thereto, said surface, as seen before, being covered by a thick oxide layer and a thick metal layer.

It will develop to the left of the collector at quite a depth in the substrate, beneath the thin gate 51 and the thin oxide layer 41 and will become flush with the surface of the substrate again as soon as it encounters the thick layer located to the right of the adjacent collector 2.

The result is that thanks to the offsetting of the thick layers in relation to the collectors, each of these latter will have a space charge region which is clearly separated from those of the two adjacent collectors. Thus, a single collector 2 corresponds with each gate 51.

If one of the gates 51 is illuminated, the electrons created by the impact of each photon will flow across the space charge region corresponding to this gate and the corresponding current pass exclusively through the corresponding collector 2.

Figure 7:
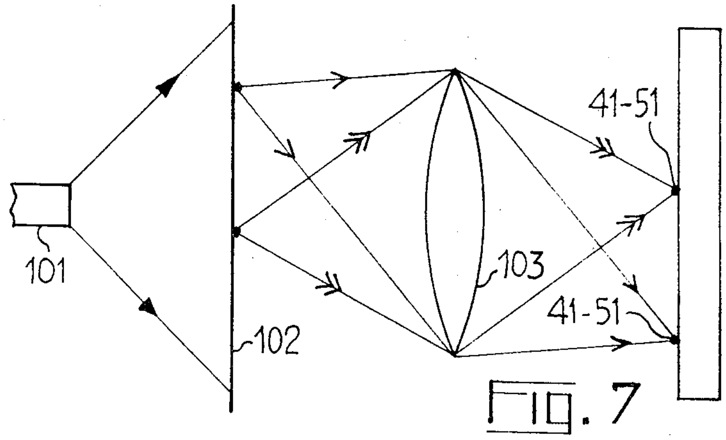
FIG. 7 illustrates an example of application of the invention.

One possible application of the invention is shown in FIG. 7.

An optical system 101 illuminates a film 102 which comprises transparent and opaque regions. This film is an optical memory or store and the illumination or opacity of a zone of the film translates the information 0 or 1 ; the image of the transparent zone is formed by a lens 103 on a gate 51.

If the corresponding line of gates is selected by the switch 100, the impact of photons on the gate 51 creates in the corresponding column of collectors a current and thus a signal in the load resistor.

In other words, selection of the line is effected by the switch whilst the selection of the columns is effected by the film itself.

The invention moreover exhibits the following advantages :

The thick metal layers reduce the input resistances of the collectors.

There is no interaction between two adjacent collectors.

I claim:

1. A metal insulator semiconductor structure comprising in combination:

a substrate having a first type of conductivity, and one face for receiving light radiation of a predetermined wavelength, an insulating layer covering partially said face;

a plurality of collectors on said face, having a second type of conductivity opposite to said first type, and associated with each of said collectors one window in said layer laying bare a part of said each collector;

ohmic contacts in said window, said insulating layer having for said each collector a first and a second portion joining together and having respective thicknesses of the order of 0.1 micron and of 1 micron, said first portion covering a first part of said collector and a part of the space between said each collector and the neighboring collector, said second portion covering partially a second part of said each collector;

a metal gate covering said first portion, having a thickness sufficiently low for being transparent to said light radiation;

a layer of metal having a thickness sufficiently high for being opaque to said light radiation, covering said second portion, said layer of metal and said gate being connected together.

2. A structure as claimed in claim 1, comprising two collectors, the gate associated with one collector being electrically connected to said metal layer associated with the other.

3. A structure as claimed in claim 1, comprising a matrix of collector having rows and columns;

collectors of a same row having associated gates interconnected; and connection means for interconnecting the collectors of a same column.

4. A structure as claimed in claim 3, wherein each gate has a rectangular form, and said thick layers of metal and said second portions of said layer, forming two superimposed bars, covering partially the collector associated with said gate.

5. A structure as claimed in claim 1, wherein a load resistor is connected to said connecting means, means being provided, for connecting said load resistor to the negative terminal of a bias source, for placing said collectors at a negative potential in relation to said substrate, said substrate having the N type of conductivity.

6. A structure as claimed in claim 5, further comprising a switch having outputs respectively connected to said gate rows and an input connected to the negative terminal of a second bias source, which produces a lower negative potential than that applied to said collectors.

* * * * *